(12) United States Patent
Slafer

(10) Patent No.: US 8,845,912 B2
(45) Date of Patent: Sep. 30, 2014

(54) TOOLS AND METHODS FOR FORMING SEMI-TRANSPARENT PATTERNING MASKS

(75) Inventor: W. Dennis Slafer, Arlington, MA (US)

(73) Assignee: MicroContinuum, Inc., Cambridge, MA (US)

( * ) Notice: Subject to any disclaimer, the term of this patent is extended or adjusted under 35 U.S.C. 154(b) by 170 days.

(21) Appl. No.: 13/302,731

(22) Filed: Nov. 22, 2011

(65) Prior Publication Data

US 2012/0125880 A1 May 24, 2012

Related U.S. Application Data

(60) Provisional application No. 61/416,011, filed on Nov. 22, 2010.

(51) Int. Cl.
*B44C 1/22* (2006.01)
(52) U.S. Cl.
USPC .................. 216/43; 216/41; 216/81; 438/725

(58) Field of Classification Search
USPC .......... 216/18, 19, 20, 40, 41, 43, 47, 12, 33, 216/35, 49, 81; 438/717, 725; 430/314, 316
See application file for complete search history.

(56) References Cited

U.S. PATENT DOCUMENTS

| 7,799,182 B2 * | 9/2010 | Lopatin et al. ............ 204/224 R |
| 7,981,814 B2 * | 7/2011 | Schaper ........................ 438/788 |
| 2006/0163736 A1 * | 7/2006 | Lee et al. ...................... 257/758 |
| 2011/0123711 A1 * | 5/2011 | Yoon et al. ..................... 427/135 |

* cited by examiner

*Primary Examiner* — Lan Vinh
(74) *Attorney, Agent, or Firm* — McDermott Will & Emery LLP

(57) ABSTRACT

Means, apparatus, systems, and/or methods are described for forming improved rigid or flexible semi-transparent imprinting templates. These templates can be used to produce patterning masks having improved resolution that do not require plasma etching for residue removal. The methods and apparatus are compatible with roll-to-roll manufacturing processes and enable roll-to-roll formation of a wide range of metal patterned films.

12 Claims, 19 Drawing Sheets

TOOLS AND METHODS FOR FORMING SEMI-TRANSPARENT PATTERNING MASKS

RELATED APPLICATIONS

This application claims priority to U.S. Provisional Patent Application No. 61/416,011, filed 22 Nov. 2010, and entitled "Tools and Methods for Forming Patterning Masks," the entire content of which is incorporated by reference herein. This application is related to the following applications, each of which is incorporated herein by reference in its entirety: U.S. application Ser. No. 11/337,013 filed 20 Jan. 2006 and entitled "Replication Tools And Related Fabrication Methods and Apparatus"; U.S. application Ser. No. 11/471,223 filed 26 Jun. 2006 and entitled "Systems and Methods for Roll-to-Roll Patterning"; U.S. application Ser. No. 11/711,928 filed 27 Feb. 2007 and entitled "Formation of Pattern Replicating Tools"; U.S. application Ser. No. 11/830,718 filed 30 Jul. 2007 and entitled "Addressable Flexible Patterns"; and, U.S. application Ser. No. 12/270,650 filed 13 Nov. 2008 and entitled "Methods and Systems for Forming Flexible Multilayer Structures".

BACKGROUND

Microscale and nanoscale patterns are used in a wide range of photonic and electronic devices and applications, including organic light emitting diodes (OLEDs), photovoltaic cells, thin-film electronic circuits, information displays, touch screens, wire-grid polarizers, metamaterial films, sensors, and many others. These devices may include components and sub-assemblies having very fine-scale circuitry and electrically conductive elements, typically fabricated using high resolution graphic arts techniques and/or semiconductor lithography.

High-resolution printing, including gravure, ink jet, etc., is a relatively inexpensive process and, limited by print resolution, is used to make the coarser patterns of these devices, typically ranging from hundreds of microns down to roughly ten microns in width. The electrical conductivity of traces made by "printed electronic" techniques, typically using metal particle or metal precursor type inks, are generally inferior to those made from bulk metals and often require thermal post-processing to achieve acceptable electrical conductivity. For producing patterns in the micron to submicron and nanometer regime, a newer process, nanoimprint lithography (NIL), is being used as an alternative to optical lithography, which is very expensive for nanometer-scale features. In NIL, a 3-dimensional (3D) master pattern (template or mold) is placed into contact with a layer of a liquid or deformable solid polymeric material, followed by the application of some amount of pressure, resulting in the polymeric material flowing into the template cavities to form the complementary structure. If the polymer material is in the form of a solid layer, heat or chemical treatment is used to soften the layer and allow it to flow into the template. After the material is solidified (either by reducing the temperature below the material's Tg or by radiation crosslinking), the template and polymer layer are separated, whereupon the polymer layer will have the (complementary) surface structure of the template.

NIL can also used to form a polymeric etch mask, essentially a stencil through whose openings material can be deposited or removed. In semiconductor lithography, such mask structures are commonly formed in a spin-coated photoresist material using optical exposure through a photomask, by direct laser or e-beam writing, or by the newer NIL process. On significant advantage of the NIL approach over optical lithography, particularly in forming very small (<100 nm) features, is that the expensive and complex optical exposure process is replaced by a much simpler mechanical imprinting process. In addition, as a parallel process, it is significantly faster than serial process of direct write lithography.

One limitation, however, of the NIL process for forming etch masks is that a very thin layer of residual polymeric material (known as the 'residue' or 'scum' layer) is left in the bottoms of the mask (i.e., closest to the substrate on which the mask is formed) after imprinting, and this layer must be removed prior to further processing (deposition or removal). Incomplete removal of the residual material from the mask will result in defects after subsequent steps: e.g., patches of missing metal after metallization in additive processing and stray patches of metal after etching in subtractive processing.

Residue removal (also known as 'de-scumming') is usually carried out by plasma (or reactive ion) etching, a vacuum process that is used to selectively remove unwanted organic or other material. Although ideally this is an anisotropic process, where material perpendicular to the source direction is removed at a faster rate than that in the parallel direction, this is not always the case, resulting in potentially significant unwanted etching of critical mask features, for example that results in widened mask openings that produces incorrect line widths.

In addition, the residue removal process has other drawbacks: 1) it requires expensive vacuum equipment with specialized gas handling and controls, 2) pump-down time to reach operation pressure adds to the processing time, 3) the etch process itself can be slow, also adding to the process time, 4) non-uniformities in the plasma field can cause non-uniform polymer removal and result in areas that are under-etched (areas of residue left intact) or over-etched (areas of mask polymer removed), and/or 5) the etch process can be detrimental to other elements of the structure (including by unwanted material removal, chemical interactions, re-deposition of etch by-products, hardening of the mask, etc.).

It is thus very desirable to be able to form mask layers that do not require plasma etch removal of the residue layer. Several processes have been developed and art well known to the art for doing this, including the use of semi-transparent or hybrid imprint masks and by modification of the surface-mask polymer wetting properties. Cheng and Gou (Xing Cheng and L Jay Guo, *One-Step Lithography For Various Size Patterns With a Hybrid Mask-Mold*, Journal Microelectronic Engineering, Vol. 71, No. 3-4, pg. 288-293, May 2004), Liao and Hsu (Wen-Chang Liao and Steve Lien-Chung Hsu, *High Aspect Ratio Pattern Transfer in Imprint Lithography Using a Hybrid Mold*, J. Vac. Sci. Technol. B 22, 2764, 2004) and Schift, et al. (Helmut Schift, Christian Spreu, Arne Schleunitz, Jens Gobrecht, Anna Klukowska, Freimut Reuther, and Gabi Gruetzner, *Easy Mask-Mold Fabrication for Combined Nanoimprint and Photolithography*, J. Vac. Sci. Technol. B 27, 2850, 2009) describe "hybrid mask-mold" processes (also known as Combined Nanoimprint and Photolithography, or CNP) in which certain portions of an imprint mask include thin film metal areas that block incident light and thereby prevent crosslinking of the underlying polymer material (what would otherwise be the residue), which is thus developable during subsequent processing. In another variant of this approach, Kao et al (Po-Ching Kao, Sheng-Yuan Chu, Chuan-Yi Zhan, Lien-Chung Hsu, Wen-Chang Liao, *Fabrication of the Patterned Flexible OLEDs Using a Combined Roller Imprinting and Photolithography Method*, 5th IEEE Conference on Nanotechnology, Volume 2, 693-695, 2005) used a hybrid mask in Hua et al. (Hua Tan, Andrew Gilbertson, and Stephen Y. Chou, Roller Nanoimprint Lithography, J. Vac. Sci. Technol. B 16, 3926, 1998) for a roller press nanoimprint lithography process. In non-CNP approach to "nonresidual layer imprinting", Pina-Hernandez et al (Carlos Pina-Hernandez, Jin-Sung Kim, Peng-Fei Fu, and L. Jay Guo, Nonresidual Layer Imprinting and New Replication Capabilities Demonstrated for Fast Thermal Curable Polydimethysiloxanes, J. Vac. Sci. Technol. B 25 (6), November/December 2007) described a process in which thermal curable polydimethylsiloxane resists and fluorinated silane surface treatments were found in certain instances to form structures without residual layers.

However, each of these approaches has certain limitations and drawbacks which the subject technology, as will be described below, overcomes. In some approaches, such as with "nonresidue layer imprinting", the requirement of a particular surfaces and surface treatments to reduce or eliminate the residue layer works under a restricted set of conditions, and further is not compatible with a broad range of materials, geometries or processes. In the case of the hybrid mask-molds, very thin metal films are used for the absorbing layers, which can result in light leakage into adjacent structures and partial exposure of the residue areas (Schift et al, FIG. 5). Furthermore, all of these processes use rigid substrates (glass, quartz) substrates which can be etched to produce the hybrid mask. Such masks are relatively fragile and expensive and are inflexible so as not to be suitable for commercial high-volume manufacturing, and in particular for roll-to-roll manufacturing.

SUMMARY

The subject technology addresses the previously-noted limitations, and can provide improved methods for forming semi-transparent ('S-T') imprint tools (templates or molds) for use in producing residue-free patterning masks and application of such method to produce large-area semi-transparent films. The improvements inherent to the subject technology, as described in detail below, can include higher resolution patterning, rapid and low-cost tool fabrication, the ability to form tools that are rigid or flexible, alteration of the aspect ratio of the relief features, and elimination of the need for costly (and relatively slow) plasma etching step for mask residue removal. The subject technology, therefore, can offer a significant improvement over the prior art used to form and use imprint tools. In a further embodiment, the process for forming semi-transparent tools of the subject technology can be carried out in a continuous roll-to-roll manner in order to either create large quantities of such tools, or to form transparent patterned electrically conductive films.

The subject technology, therefore, is of particular value when applied to high-volume roll-to-roll production of materials and devices in which lithographic relief masks are used for subtractive and/or additive processing due to the elimination of the roll vacuum plasma etching step. This step represents a significant manufacturing process "bottleneck" with high capital costs, relatively low throughput, and increased production times. By completely eliminating this bottleneck, production throughput is greatly increased and costs associated with patterning are greatly reduced. The methods of the subject technology can therefore be applied, for example, to the low-cost roll-to-roll production of high-resolution patterned conductors.

The above summary of the subject technology is not intended to describe each embodiment of every implementation of the subject technology. It will be understood by one skilled in the art that the embodiments depicted in the drawings are illustrative and variations of those shown as well as other embodiments described herein may be envisioned and practiced within the scope of the disclosure.

BRIEF DESCRIPTION OF DRAWINGS

The drawing figures depict one or more implementations in accord with the present teachings, by way of example only, not by way of limitation. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it refers to the same or like components or steps. The drawings are not necessarily to scale, emphasis instead being placed on the principles of the disclosure. In the drawings.

Figure 1:
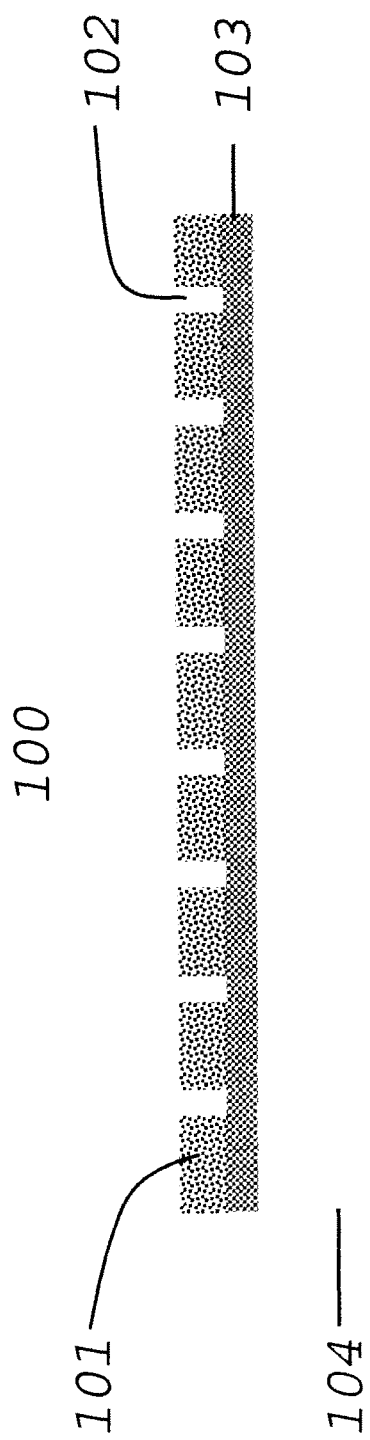
FIG. 1 shows a cross-sectional view of an example of a transparent substrate coated with a seed layer and a relief pattern mask on the seed layer, with the seed layer selectively exposed through the openings in the pattern mask, in accordance with the subject technology.

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, and/or techniques have been described at a relatively high-level, without detail, in order to avoid unnecessarily obscuring aspects of the present teachings.

The subject technology is directed toward improved methods and systems for forming rigid and flexible semi-transparent (S-T) imprint tools. A significant advantage of such tools is that they can be used to make imprint lithography masks that do not require plasma etching to remove the residue (scum) material that is an unwanted characteristic of the formation of such masks. Such plasma-etch-free masks, when used with the methods of additive and/or subtractive pattern formation processes known to the art, are useful in the formation of many types of patterned materials and devices, such as described above. The subject technology can provide a continuous roll-to-roll process utilizing semi-transparent imprint tools to form plasma-etch-free masks. Further, the subject technology can provide a continuous roll-to-roll process for producing such plasma-etch-free masks semi-transparent films for use as transparent electrical conductors.

A significant distinction exists between the widely-used conventional photomask exposure and the semi-transparent imprint mask. The typical photomask includes a glass plate having on one side a metal (typically chrome) layer from which metal has been selectively removed to form a pattern of optically transmissive and opaque areas. This photomask plate is placed in contact with a photosensitive layer on a substrate and the photosensitive layer is exposed by light passing through the transparent areas of the photomask plate. Because the photomask pattern layers are essentially planar, light that is transmitted through the openings can diffract, scatter and spread and make multiple bounces within the resist layer, thereby causing the unwanted exposure of areas that should not have been exposed. Diffraction is particularly problematic for finer features (below a few microns), limiting the use of photomasks with standard (visible) light sources to larger (multi-micron) features and above. In order to form patterns with smaller features, shorter wavelength light sources and more precise mask handling are required, and this can become prohibitively expensive for nanoscale features. Thus the NIL process, being essentially mechanical imprinting, can overcome these problems, except for the addition of the problem of imprint residue removal. Thus the S-T mask tools made by the subject technology can both readily form submicron features while eliminating the plasma residue removal step.

FIG. 1 illustrates an example of an improved method of the present disclosure for forming a semi-transparent imprinting tool. FIG. 1 depicts a substrate 100 which includes a support layer 104 (which can be transparent or flexible) having a "seed" layer 103 over which is formed a patterned relief layer 101. The seed layer 103 can be a layer of any one or more suitable materials that can enable electro- or electroless plating of a material from solution, particularly a metal or metal alloy. For electroplating, this seed layer 103 can include or be formed of an electrically conductive metal, such as Ni, Ag, Au, etc., but can also be a conductive polymer (PEDOT:PSS), an transparent conductive oxide ('TCO') such as indium tin oxide (ITO), conductive carbon, etc. For electroless plating, the seed layer 103 can include or consist of very small nanoparticles that nucleate chemical deposition. Both types of plating are well known and have been used for many years. The seed layer can include or be formed of an electroless metal nucleation layer for the electroless deposition of metals, such as but not limited to, Ni, Cu, Ag, Au, etc. The relief pattern can be applied over the seed layer 103; in some embodiments, the relief pattern can be electrically non-conductive, e.g., for electroplating, or can form a nucleation site, e.g., for electroless deposition. Relief pattern 101 can be formed on or in a layer of material that can be composed of or include a suitable polymeric material such as a radiation-curable acrylic polymer or other radiation-curable material. For some embodiments, relief pattern 101 can be formed by the radiation activated crosslinking of a suitable monomer solution. In an exemplary embodiment, relief pattern 101 can be formed in a material layer including a radiation-curable acrylic polymer made commercially available as Norland Optical Adhesive NOA 72 (Norland Products Inc., Cranbury N.J.). As shown, relief pattern 101 has openings 102 that expose the underlying seed layer for subsequent plating. For the purposes of this discussion, relief pattern 101 may be referred to as a "relief mask" or "polymer mask" or (in the case reserved for the formation of an original pattern), a "master pattern". This distinction, however, is not of major significance, as subsequent processing is generally similar.

Figure 2:
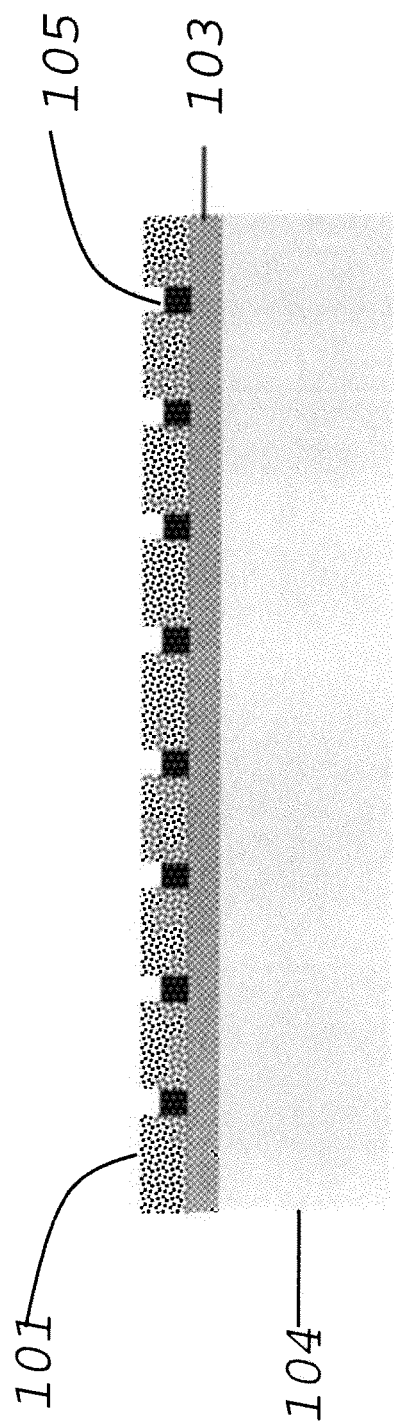
FIG. 2 is a cross-sectional view of the structure of FIG. 1 in which metal has been deposited in and partially filled the mask openings.
Figure 3:
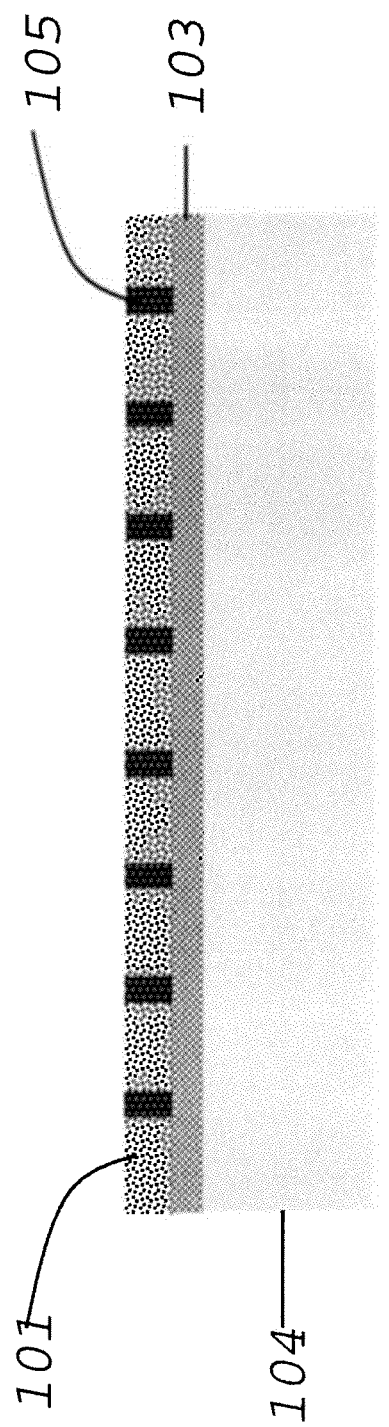
FIG. 3 is a cross-sectional view of the structure of FIG. 2 in which the metal has completely filled the mask openings.

FIG. 2 shows substrate 100 after metal 105 has been deposited in openings 102 (FIG. 1) from the action of a plating bath (not shown). The thickness of the metal layer is proportional to the electrical charge transferred during the electroplating, and the time, temperature, concentration etc., for electroless plating. The plating can be terminated when the desired metal thickness (height) is reached. FIG. 3 shows an example in which metal 105 is plated until it reaches the top of relief pattern 101. For the purposes of this discussion, the structures shown in FIGS. 2 and 3 will be referred to a "donor layer" or "donor sheet", the reason for which will become obvious subsequently in this discussion.

Figure 4:
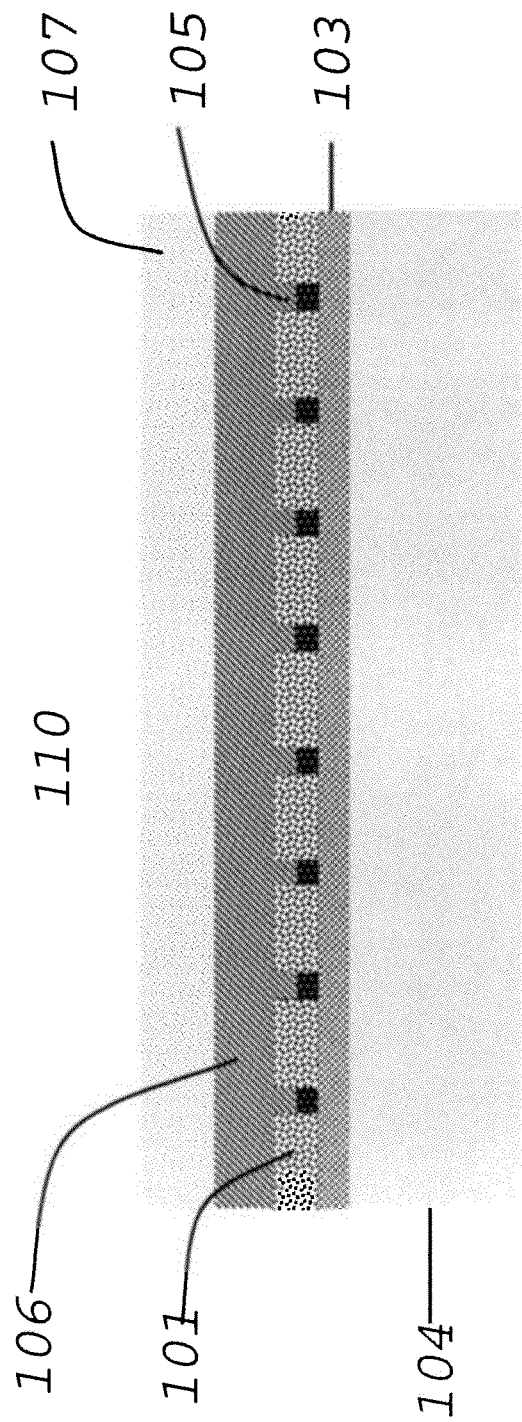
FIG. 4 is a cross-sectional view of the structure of FIG. 2 in which a transparent upper substrate is attached to the lower structure with a transparent adhesive layer.
Figure 5:
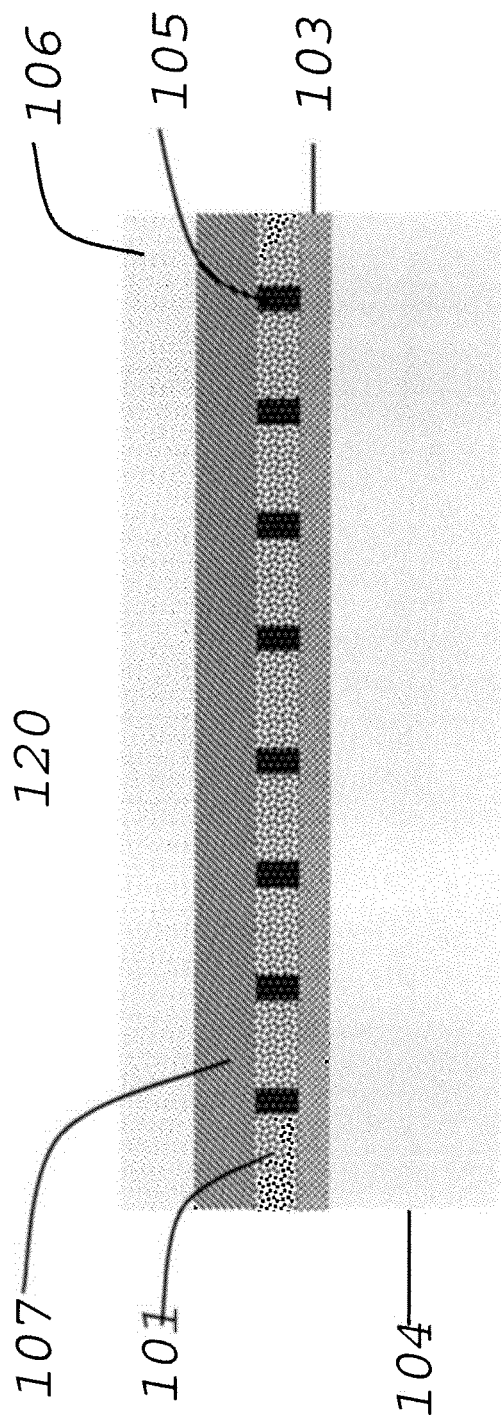
FIG. 5 is a cross-sectional view of the structure of FIG. 3 in which a transparent upper substrate is attached to the lower structure with a transparent adhesive layer.

FIG. 4 depicts structure 110 in which a transparent adhesive layer 106 is bonded to an transparent upper substrate 107. Bonding can be carried out by lamination (by roll or press, etc.) of the plated lower substrate shown in FIG. 2 or 3 to a transparent upper substrate using a transparent adhesive as the lamination agent. UV curable, epoxy, silicone, pressure sensitive, etc. can be used for this bonding step, but the adhesive preferably has adequate adhesion to the plated metal so that the metal does not separate during subsequent imprinting use. FIG. 5 shows structure 120 in which the filled relief pattern is bonded to the upper substrate.

Figure 6A:
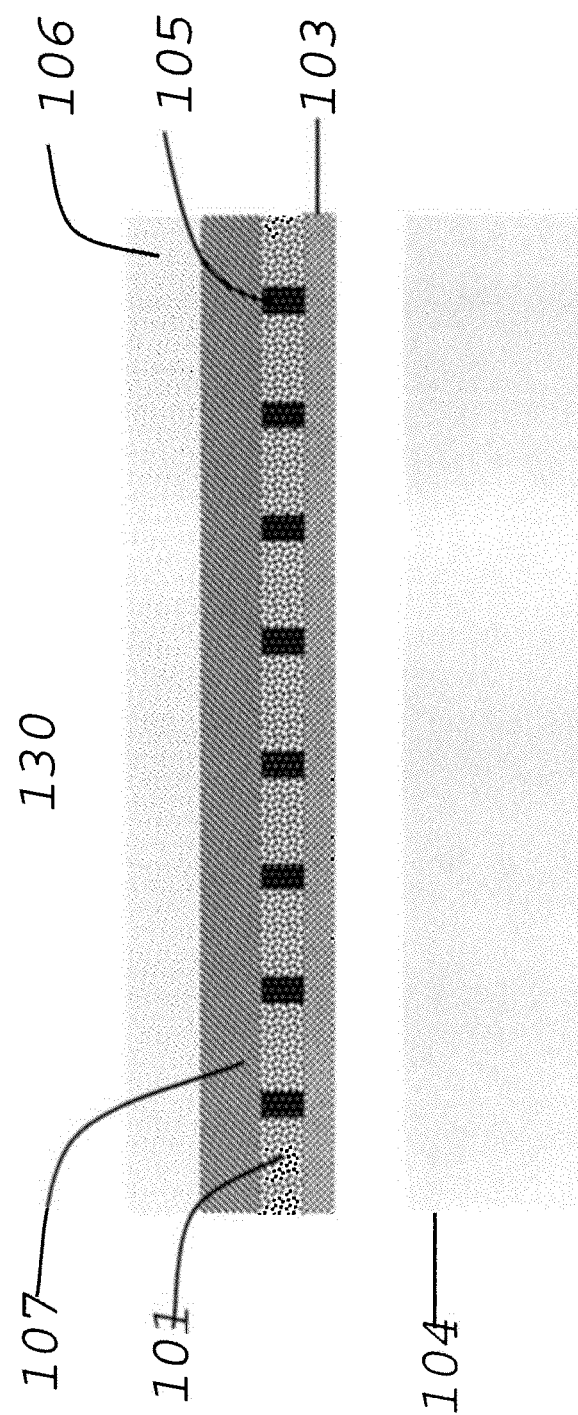
FIG. 6a is a cross-sectional view of the structure of FIG. 5 with the lower substrate separated from the upper structure.

FIG. 6a depicts the delamination of the lower substrate ("donor sheet") from upper structure 130, where separation has occurred at the interface between the seed layer 103 and the support layer 104. For the purposes of this discussion, structure 130 and the like will be referred to as "receiving layers" or "receiving sheets".

For certain applications, such as, for example, OLED lighting and certain PV cells, it is can be beneficial to leave pattern layer 101 and/or seed layer 103 in place, as this will produce an essentially planar surface, where using a transparent seed layer 103 (such as ITO, carbon nanotubes, silver or other metallic nanowires, organic conductor PEDOT:PSS, etc. or other transparent conductive materials) can provide continuous electrical conductivity ("field conductor") over the entire surface rather than just the metal pattern, for applications where this is beneficial or required.

Figure 6B:
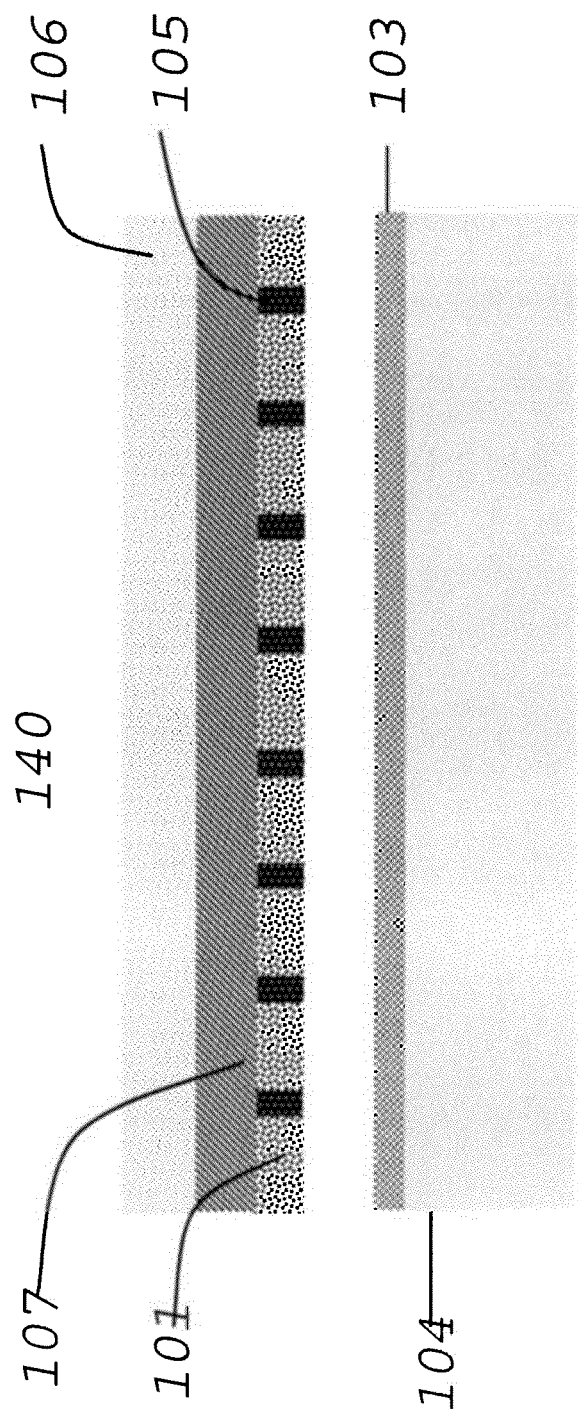
FIG. 6b is a cross-sectional view of the structure of FIG. 5 with the lower substrate and seed layer separated from the upper structure.

FIG. 6b depicts the separation of donor sheet 104 from receiver sheet 140, but in this example the delamination occurs at the interface between the seed layer 103 and the plated relief mask layer. Although this illustrations shows fully filled relief structure, a partially filled structure, such as shown in FIG. 2, can also be used.

Figure 6C:
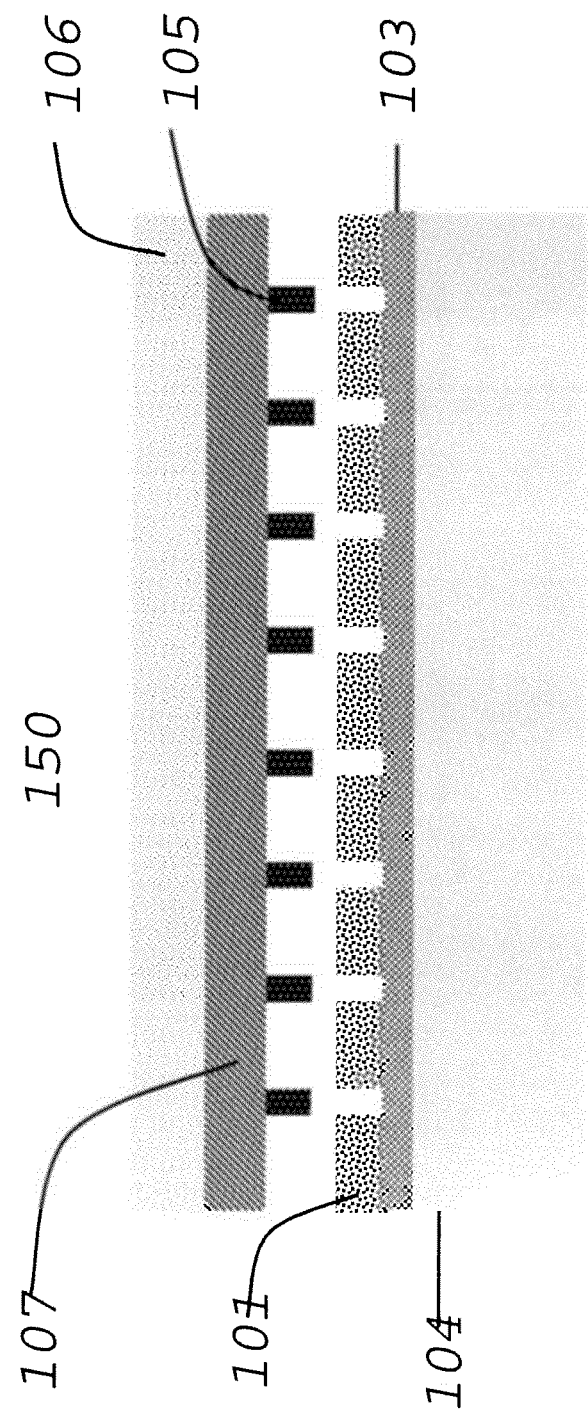
FIG. 6c is a cross-sectional view of the structure of FIG. 5 in which the metal layer is separated from the lower substrate, seed layer and imprinted layer.

FIG. 6c shows a third embodiment of the delamination step, where in this example receiving sheet 150 separates from the lower substrate at the interface between the relief mask 101 and the plated metal/adhesive layers 105/107 without destruction of the relief structure. One advantage of this embodiment is that, by selecting a seed layer with low adhesion to the plated material (such as ITO and Ni, respectively, for example) and the use of an imprint polymer (such as a radiation-cured acrylic polymer, etc.) that likewise has low adhesion to the plated metal and bonding material, the subsequent separation leaves the mold intact for re-use. The 3 cases illustrated in FIGS. 6a-c each have advantages, and the application of specific release layers at the interface where separation is desired (not shown) can be used to facilitate the desired separation.

The step that is carried out after separation depends upon which of the 3 separation methods were used to produce the receiving sheet. In the case shown in FIGS. 6a and 6b, the inclusion of a release layer at the selected interface can facilitate the desired separation, although it is also possible to selectively use materials for this process whose intrinsic adhesion allows natural separation at the desired interface. For example, if the seed layer has weaker adhesion to the lower substrate than it has to the plated metal/relief pattern material, then separation will occur at the lower substrate. Depending upon which layers that remain with the receiving sheet, chemical or plasma etching are used to selectively remove the seed layer (not shown) and/or part or all of the relief pattern.

Figure 7A:
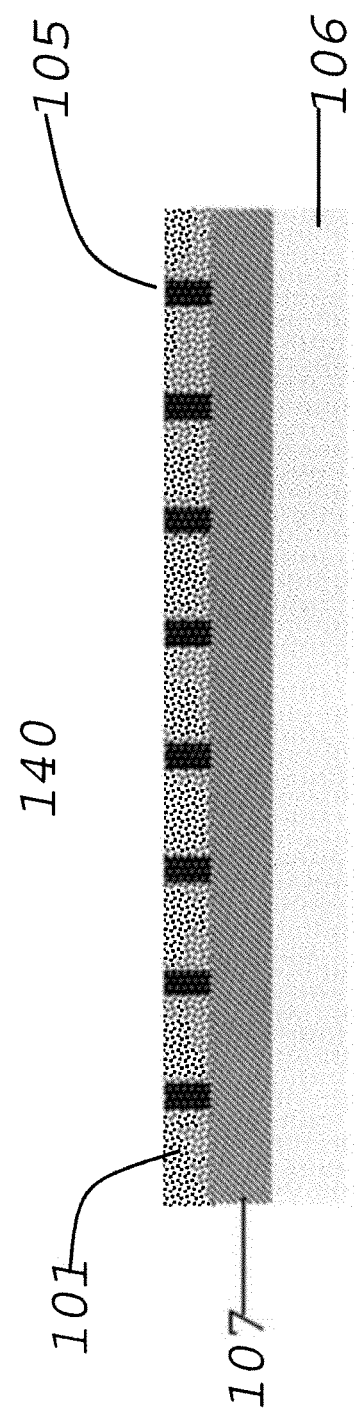
FIG. 7a is a cross-sectional view of the structure of FIG. 6b in which the metal layer has been deposited to fill the mask layer.
Figure 7B:
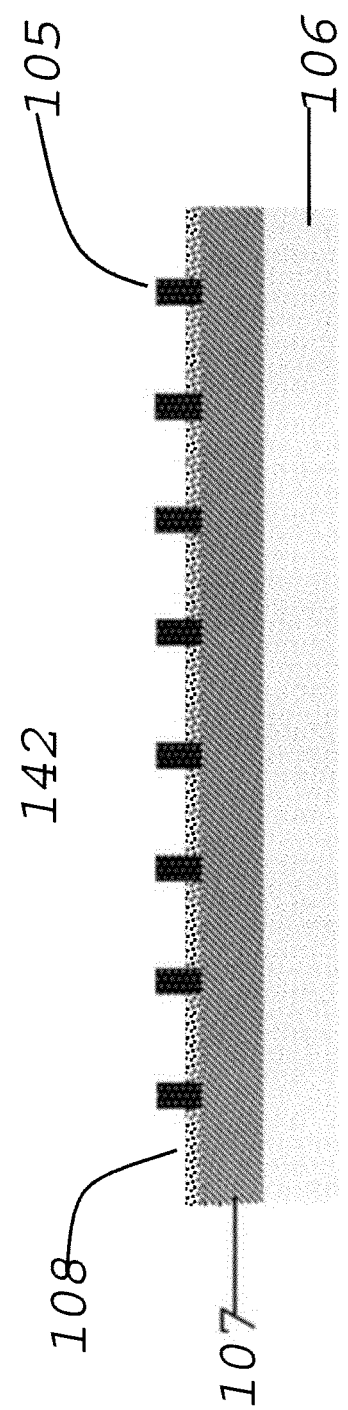
FIG. 7b is a cross-sectional view of the structure of FIG. 7a in which the mask polymer has been partially removed.
Figure 7C:
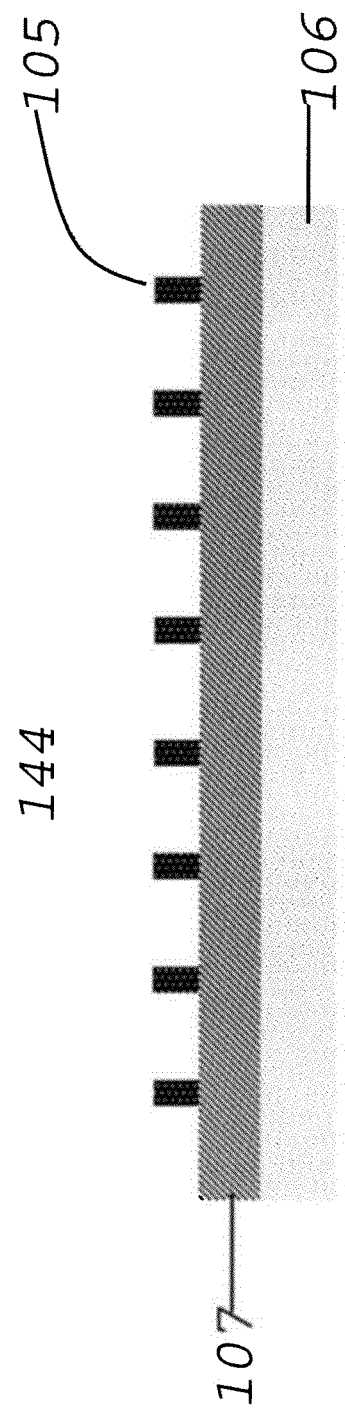
FIG. 7c is a cross-sectional view of the structure of FIG. 7a in which the mask polymer has been fully removed.

This is illustrated in FIG. 7a-c, where FIG. 7a shows the case of separation at the seed layer-plated metal interface (FIG. 6b) to produce structure 140. FIG. 7b shows partial removal of the relief pattern material to produce structure 142, and FIG. 7c show complete removal of the relief pattern material to produce structure 144.

Figure 7D:
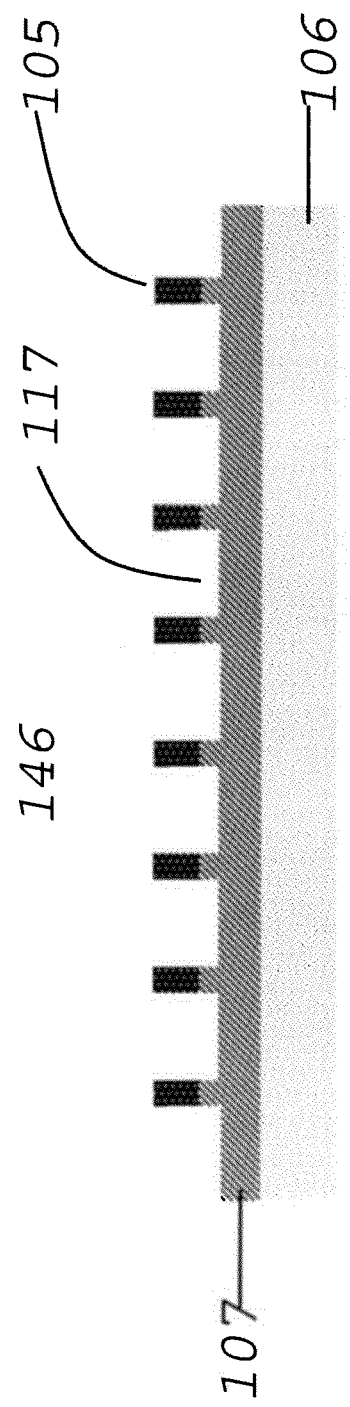
FIG. 7d is a cross-sectional view of the structure of FIG. 7a in which the mask polymer has been fully removed and the adhesive layer partially removed.

The methods of this invention allow the opportunity to modify both the metal thickness (for optimum opacity or electrical conductivity) and the step height of the relief pattern. The depth (or 'height') of the relief pattern can be adjusted by the degree of etching used to remove the seed and mask material (FIG. 7d). Thus tools can be formed whose relief is greater (117) or lesser (108 in FIG. 7d) relief than the original by the means of this invention, which represents a considerable savings in time and cost compared to generating another master pattern. Furthermore, plasma etching of the seed/polymer layer in a S-T tool is more selective than carrying out the same process with a thin-film metal mask, as described in the prior art. This is because the plated metal will have a negligible plasma etch rate compared to that of the polymer relief pattern using the typical plasma gas mixture used for polymers, allowing deep etching in which the etched area is confined to the polymer area, minimizing the undercutting that would otherwise occur if the metal was a thin-film layer.

Figure 7E:
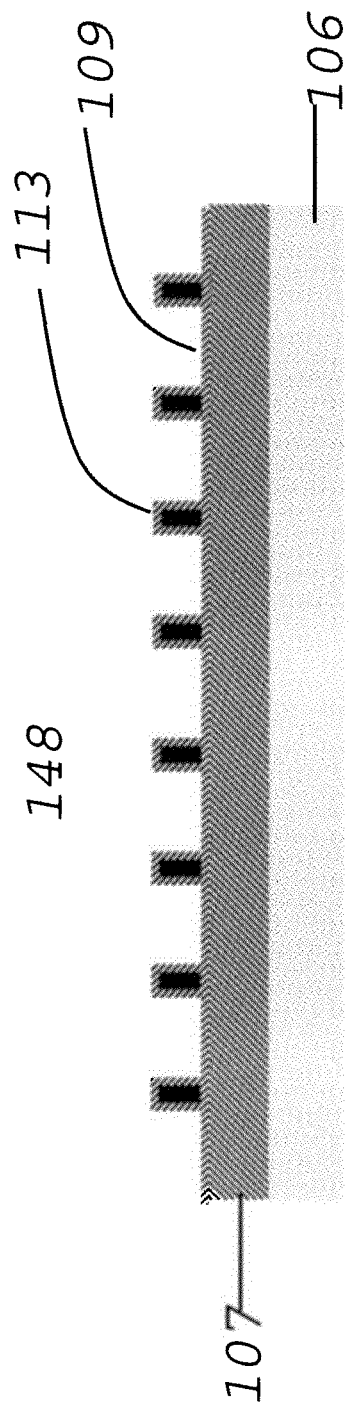
FIG. 7e is a cross-sectional view of the structure of FIG. 7d in which the metal layer has been overcoated with a conformal release layer.

The case in which a release layer is applied to the S-T tool is shown in FIG. 7e, where layer 113 is a Teflon-based or other such low-adhesion layer, as is known to the art is used to facilitate separation, when needed.

Figure 8A:
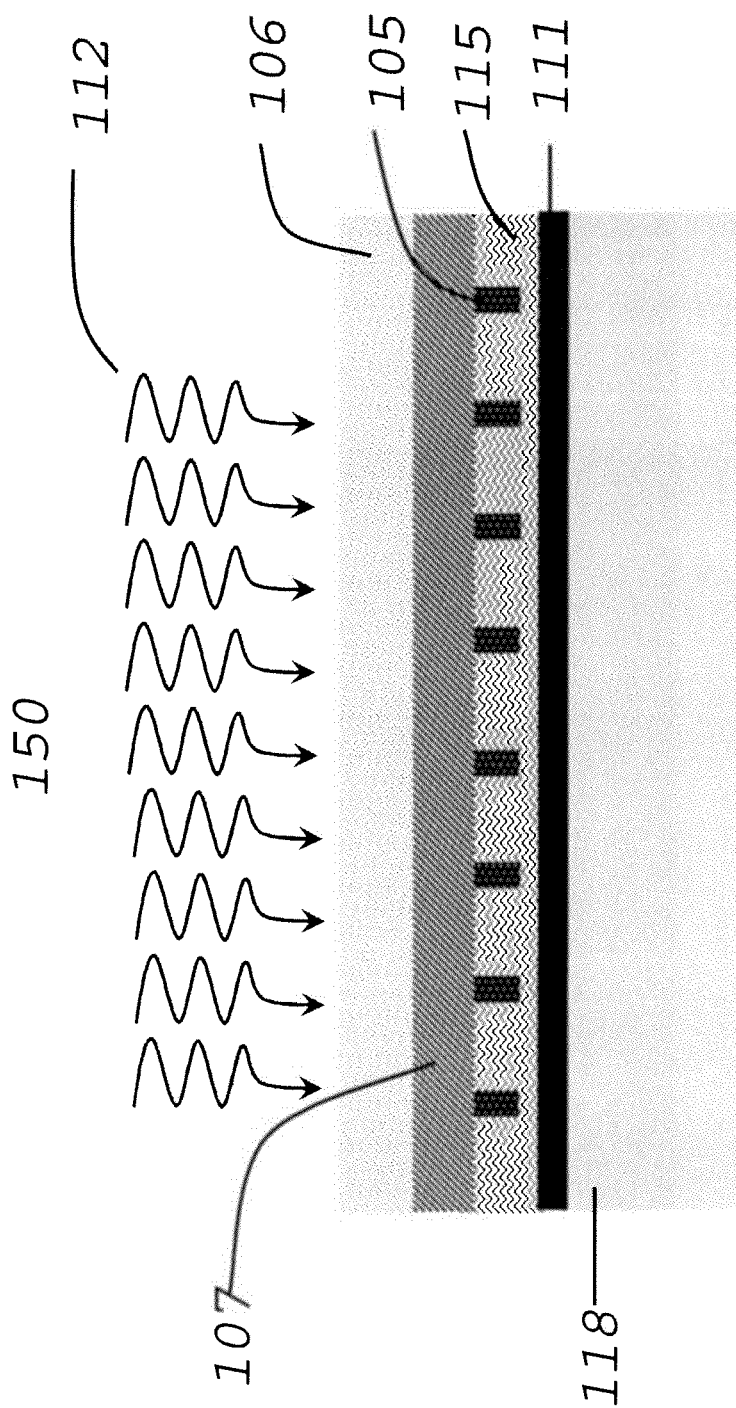
FIG. 8a shows structure of FIG. 7c in contact with a metallized lower substrate and an imprint material in the presence of radiation used to harden the imprint material.
Figure 8B:
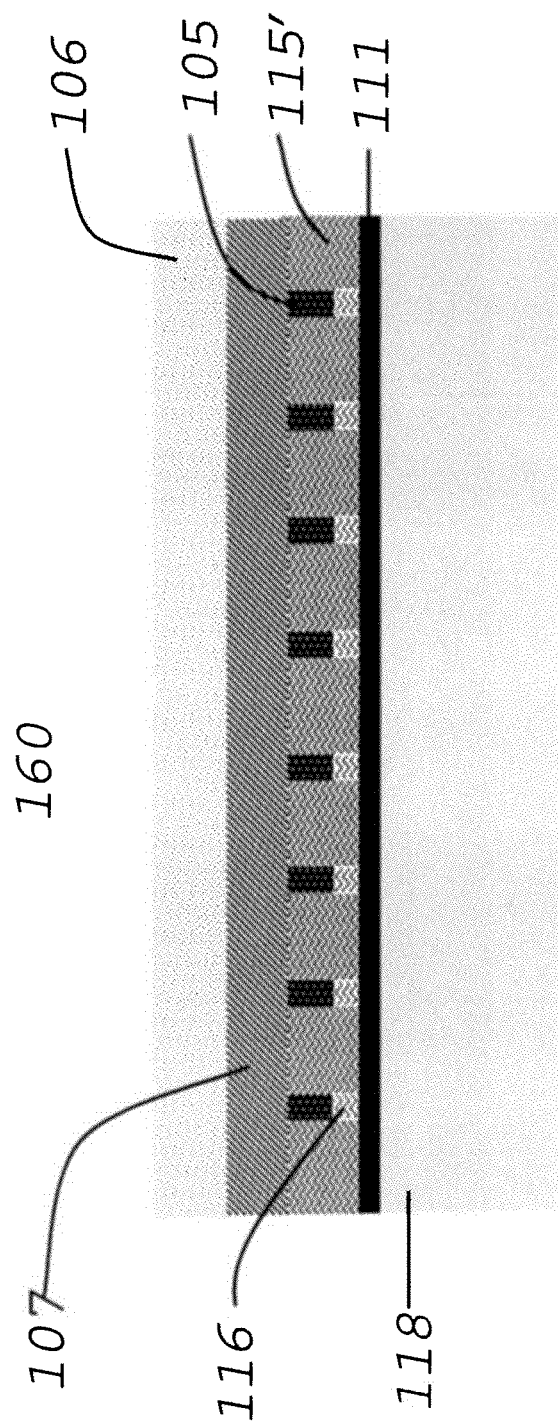
FIG. 8b shows structure of FIG. 8a after exposure of the imprint material through the upper structure (semi-transparent imprinting tool), showing hardened and non-hardened imprint material.
Figure 8C:
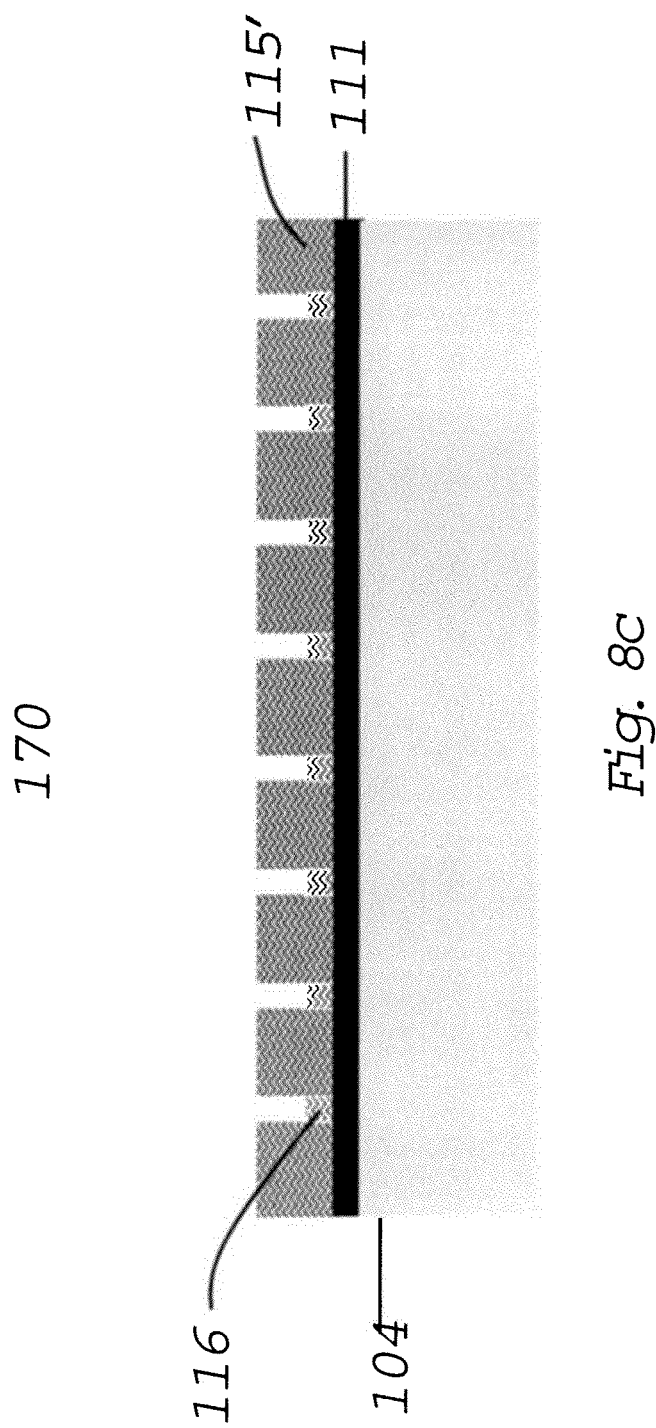
FIG. 8c shows structure of FIG. 8b after separation of the semi-transparent imprinting tool.
Figure 8D:
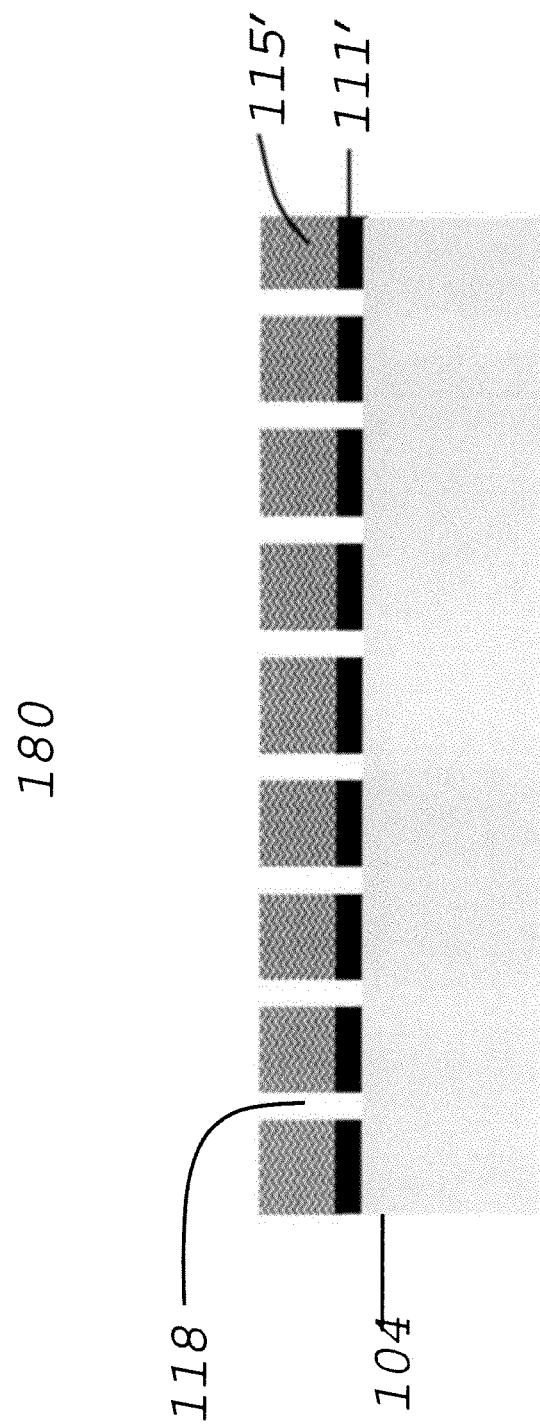
FIG. 8d shows structure of FIG. 8c after removal of the non-hardened imprint material.

An example of the use of the improved semi-transparent imprinting tool is given in FIG. 8a-d. In FIG. 8a, structure 150 can include a substrate in contact with the tool and an intervening imprinting fluid. A lower substrate 118 (rigid or flexible, transparent or opaque) is coated with the metal layer 111 to be patterned. A semi-transparent tool including support 106, adhesive layer 107, and opaque pattern 105 is placed into contact with the lower substrate wherein a layer of radiation-curable monomeric material 115 is spread between the tool and the substrate. A radiation source 112, which is capable of causing solidification (e.g., by cross-linking) of material 115, is applied from the back side of the semi-transparent tool, whereby only the transparent parts of fluid 115 are irradiated and hardened. Structure 160 of FIG. 8b shows the hardened material 115' and the un-hardened material 116 under the opaque tool elements 105. The depth of the opaque elements of the tool traps the radiation and minimizes stray reflections from exposing the material 116 under the opaque elements. After exposure has been completed, the tool and substrate are separated, forming structure 170 shown in FIG. 8c. Un-hardened residue 116 can be readily removed by developer, solvent or other chemical means. FIG. 8d illustrates the subsequent processing of the masked substrate after residue removal, where chemical (or plasma) etching known to the art is used to remove metal from the area 118 exposed through the polymeric mask. The result is layer 111' having metal layer selectively patterned. The last step (not shown) is the removal of the spent polymeric mask 115', which can be done using chemical means (e.g., a solvent, developer, etc.) or mechanical means. It should be noted that, in exemplary embodiments, this critical step reveals the patterned metal layer, which is preferably free of debris and un-removed mask material. This is a significant problem when such masks are plasma etched to remove the residue layer, as plasma hardening makes these materials virtually totally resistant to chemical removal, and mechanical means can often be problematic and result in incomplete polymer removal.

Experimental details of one embodiment of the formation of a semi-transparent imprinting tool are as follows: a commercial film consisting of a 7 mil thick polyethylene terephthalatephthlate (PET) support and an electrically conductive ITO layer having a surface conductivity of 100 ohms/square (SP-7013-100-5 from Techni-Met Inc., Windsor Conn.) was used as the lower substrate plus seed layer and a relief pattern was formed on the ITO surface using the well-known process of a transparent imprint tool and an acrylic UV adhesive. The pattern consisted of 20 micron wide trenches that were 4-5 microns deep, and the residue layer at the bottom of the trenches was removed by plasma etching using a inductively coupled plasma (ICP) equipped Trion Minilock II (Trion Technology, Clearwater Fla.) with an O2/Ar gas mixture, a process known to the art.

The substrate with cleaned relief pattern was immersed in a Ni sulfamate electroforming bath having a Ni foil anode, and electrical contact was made to an expose section of the ITO layer of the patterned substrate to form the cathode. A current of 0.5 A at 5 V was used to deposit a 3-4 micron thick layer of Ni in the trenches at which time the substrates was removed from the electroforming bath, rinsed and dried. The semi-transparent tool so formed was used to imprint another acrylic material using long-wave UV radiation to cross-link the monomer on a 5 mil thick PET substrate that had been coated with a 100 nm thick layer of aluminum, where the exposure radiation was from the semi-transparent tool side during curing (typically less than 5 sec cure time). The tool and substrate were separated and the uncured monomer ("residue") was removed by isopropyl alcohol rinse. The thus-formed polymer masked substrate had no residue layer and did not require plasma etching and could thus be further etched to remove the exposed aluminum metal by chemical etching.

The method of the subject technology for producing S-T tools can also be used to form transparent conductive structures, such as a TCF. In this case, the plated metal (such as Ag, Au, Ni, Cu etc.) is selected for the desired conductor properties rather than solely for its imprinting durability (such as electroformed Ni), and the plating conditions (current/voltage, time, temperature etc.) are used to control the thickness of the deposited metal, which in turn will produce the desired electrical conductivity of the TCF. Because plating processes are capable of depositing many microns of metal in a matter of minutes, it is possible to achieve high surface conductivities (to less than 1 ohm/square) by forming thicker conductive grids with this method. This is significant for transparent conductors that are used in high current applications, such as large-area OLED lighting and PV energy conversion. The roll formation of such films, as well as S-T tool films, is illustrated in the following example.

Figure 9:
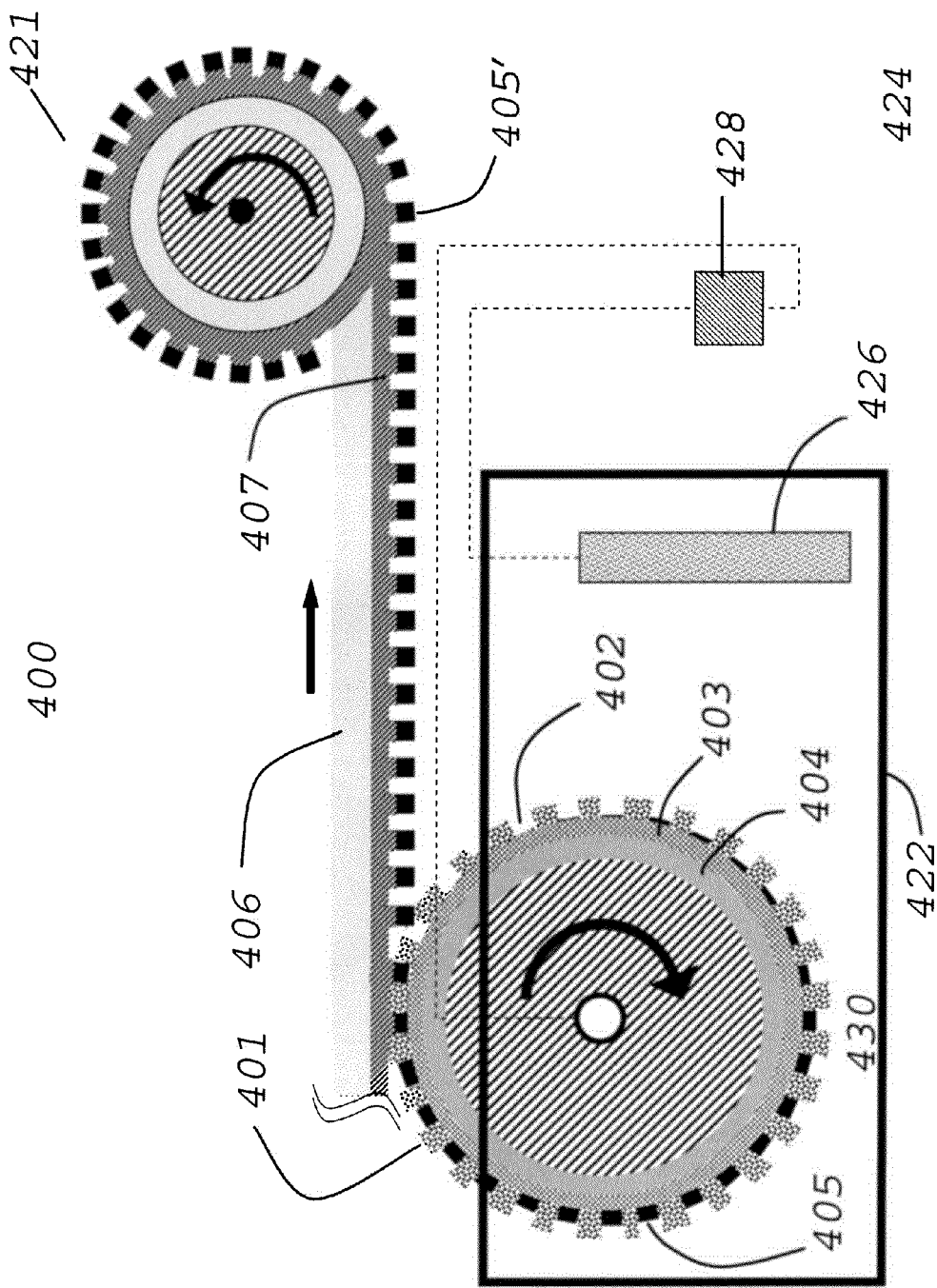
FIG. 9 is a cross-sectional view of an example of apparatus for producing continuous films of semitransparent material for imprint tools or for transparent conductive films.

FIG. 9 shows a roll-to-roll process that can be used either to form semi-transparent imprinting tools (S-T tools) or to form such transparent conductive films (TCFs), as described above. Apparatus 400 can include a continuously rotating plating cylinder (or belt or spool-to-spool configuration) 430 immersed in plating bath 422, which in the case of this example is an electroplating bath, although an electroless plating bath can also be used according to the disclosed elements of this invention. The plating drum 430 can include a permanent seed layer 403, such as a metal or conductive oxide or polymer or other material whose adhesion to the material deposited by the bath is relatively weak, and a polymeric layer 401 is used to form the relief pattern. In this example, the conductive layer 403 is ITO (and passivated Ni has also been used), and deposited metal 405 was Ni deposited from a Ni sulfamate electroforming bath 422, a process well known to the art. A rotary slip-ring (not shown) is used to make contact with the cathode (the conductive layer 403), and Ni anode 426 is used to replenish the Ni deposited from the plating solution. The circuit is established by connecting the anode and cathode to power supply 248. As drum 430 rotates, metal 405 is deposited on conductive layer 403 through pattern openings 402. The thickness is controlled by plating voltage/current, temperature and bath dwell time, and the plated metal is transferred from the drum to the receiving substrate 406 from a supply roll (not shown) by action of adhesive 407 (which can be radiation-activated, heat-activated, epoxy, pressure sensitive or other transparent adhesive). Rinsing of the plated drum may be optionally carried out, as needed, prior to lamination to substrate 406. The substrate 406 with metal layer 405' removed from the drum is subsequently rewound onto take-up spool 421, while the drum area 402 from which the metal has been removed is re-immersed in the plating bath for deposition of more metal.

Figure 10:
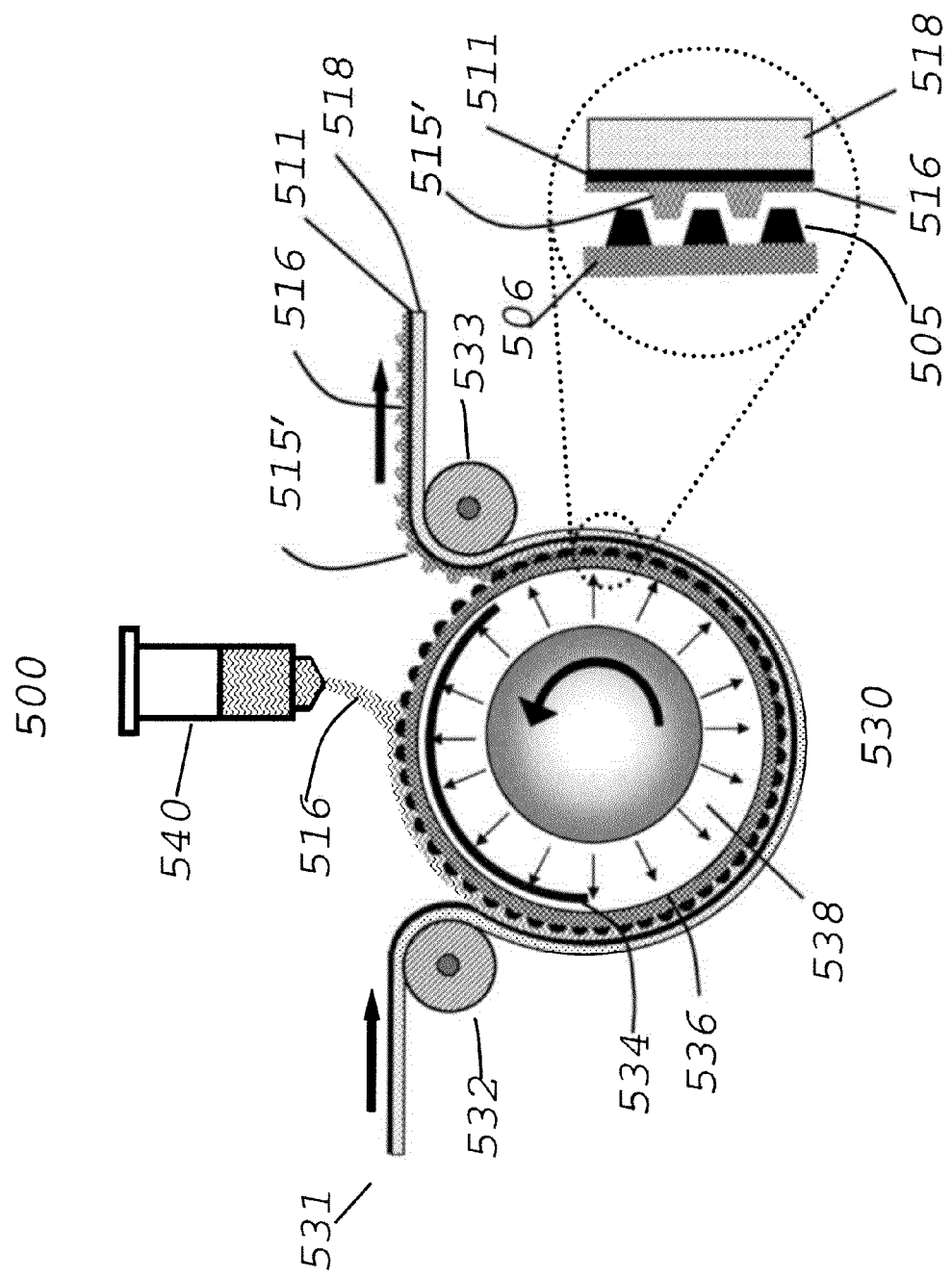
FIG. 10 is a cross-sectional view of an example of continuous roll-to-roll apparatus for producing polymer masked films that do not require plasma etch residue removal.

In addition to the roll-to-roll plating process to form S-T tools and TCFs, flexible S-T tools can also be incorporated into a roll-to-roll imprinting process to produce polymer relief masks in large quantities. Such masks are used to form fine-detailed conductive structures used in flexible electronics, touch screens, displays, OLED lighting, PV cells, as described previously. FIG. 10 depicts the embodiment of the use of a rotary S-T tool in a continuous roll-to-roll imprinting process for producing a film having a polymer relief mask that can be used for subtractive or additive processing, but without requiring the film be plasma etched. In this example, an imprint drum assembly 530 can be composed of or include a transparent support drum (drum or belt) element to which is adhesively bonded a length of S-T tool made any of by the methods disclosed above. Transparent support 506 of the S-T tool is bonded with a transparent adhesive (radiation curable, thermal adhesive, pressure sensitive, epoxy, etc.) to the transparent support 536 (not shown in detail to eliminate clutter in sketch). The example in FIG. 10 illustrates a subtractive process in which a metallized plastic film 531 is to be patterned. A UV-cure monomer 516 is applied to the surface of drum 530 (although it can be also applied to film 531), which is laminated against drum 530 and film 531 with the action of pressure roller 532. Here, an exposure configuration in required in which the radiation source (for example, from solid-state diodes whose output wavelength is capable of causing the imprint fluid to cross-link) is mounted inside the rotating semi-transparent imprint drum. As the drum rotates in contact with the film, radiation from the light source 538 is transmitted through the rotary S-T tool to harden fluid 516. An exposure shield 534 is provided to prevent premature exposure of the imprint fluid. The film is continuously delaminated from the S-T drum at roller 533, with the film at this point including hardened relief pattern 515' and un-cured residue layer 516 on metal layer 511. The next steps (not shown) include removal of un-cured residue layer 516 by transport through a chemical rinse tank, the either rewind or metal removal by transport through a chemical etch tank.

Accordingly, aspects and embodiments of the subject technology in accordance with the description herein can afford one or more advantages relative to prior techniques and art. For example, aspects and embodiments of the present disclosure can provide for the elimination of a plasma etching step. The plasma etch process generates a large amount of very short wave radiation and ion bombardment, as well as possible re-deposition of etch by-products. This can have a strong effect on the polymeric mask material, particularly in extreme crosslinking and surface reactions that make subsequent mask removal very difficult, if not impossible. By eliminating the plasma etch step, the polymer mask can be readily removed from the metal layer using relatively mild chemical treatment and minimization of damage to the underlying metal layer.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. The foregoing notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for forming a semi-transparent imprinting template, the method comprising:
    applying a first material, having at least one organic material layer, onto a seed layer disposed on a first support surface;
    forming a relief pattern on the organic material layer;
    selectively removing material from the thinnest portions of the relief pattern of the organic material layer, wherein the seed layer is exposed through the openings formed in the relief pattern;
    depositing onto the seed layer an opaque second material by electrodeposition or electroless deposition;
    adhesively bonding a transparent upper support layer to the relief pattern containing the second material, wherein the adhesive and upper support layer are optically transparent;
    separating the deposited material, that is bonded to the upper support layer, from the first support surface; and
    forming a semi-transparent relief pattern by removing an amount of the first organic material.

2. The method of claim 1, wherein the seed layer comprises an electrically conductive material.

3. The method of claim 1, wherein the seed layer comprises an electroless metal nucleation layer for the electroless deposition of metals.

4. The method of claim 1, wherein the relief pattern is formed by radiation curing of a liquid monomer material.

5. The method of claim 1, wherein the relief pattern is formed by thermal or chemical molding of a polymeric material.

6. The method of claim 1, wherein an organic residue material is removed by the process of plasma or chemical etching.

7. The method of claim 1, wherein the support layer is a flexible polymeric film.

8. The method of claim 1, wherein separation of the upper and lower support occurs between the deposited material and the relief pattern.

9. The method of claim 1, wherein separation of the upper and lower support occurs between the relief pattern and the seed layer.

10. The method of claim 1, wherein the depth of the relief pattern is modified by the selective removal of the organic material.

11. A method in claim 1, wherein plasma etching is used to modify the depth of the relief pattern.

12. A method for forming a semi-transparent imprinting template, the method comprising:
    applying a first material, having at least one organic material layer, onto a seed layer disposed on a first support surface;
    forming a relief pattern on the organic material layer;
    selectively removing material from the thinnest portions of the relief pattern of the organic material layer, wherein the seed layer is exposed through the openings formed in the relief pattern;
    depositing onto the seed layer an opaque second material by electrodeposition or electroless deposition;
    adhesively bonding an upper transparent support layer to the relief pattern containing the second material, wherein the adhesive and upper support layer are optically transparent;
    separating the deposited material with bonded upper support layer from first support surface; and
    forming a semi-transparent relief pattern by removing an amount of the first organic material; wherein separation of the upper and lower support occurs between the seed layer and first support.

* * * * *